United States Patent
Matumoto

(10) Patent No.: US 6,707,835 B2
(45) Date of Patent: Mar. 16, 2004

(54) PROCESS FOR PRODUCING SEMICONDUCTOR LASER ELEMENT INCLUDING S-ARROW STRUCTURE FORMED BY ETCHING THROUGH MASK HAVING PAIR OF PARALLEL OPENINGS

(75) Inventor: Kenji Matumoto, Kaisei-machi (JP)

(73) Assignee: Fuji Photo Film Co., Ltd., Kanagawa-Ken (JP)

(*) Notice: Subject to any disclaimer, the term of this patent is extended or adjusted under 35 U.S.C. 154(b) by 0 days.

(21) Appl. No.: 10/207,803

(22) Filed: Jul. 31, 2002

(65) Prior Publication Data

US 2003/0026309 A1 Feb. 6, 2003

(30) Foreign Application Priority Data

Aug. 1, 2001 (JP) ........................................ 2001-233293

(51) Int. Cl.[7] ................................................. H01S 5/00
(52) U.S. Cl. .......................................... 372/46; 438/39
(58) Field of Search ............................... 372/66; 438/39, 438/43

(56) References Cited

U.S. PATENT DOCUMENTS 5,029,175 A * 7/1991 Ohnaka et al. ................ 372/46
5,143,863 A * 9/1992 Ohnaka et al. ................ 438/39
5,585,309 A * 12/1996 Mori et al. ..................... 438/43
2002/0105989 A1 * 8/2002 Matsuyama ..................... 372/46

OTHER PUBLICATIONS

IEEE Photonics Technology Letters, vol. 10, No. 8, Aug. 1998, pp. 1079–1081.

* cited by examiner

*Primary Examiner*—Paul Ip
*Assistant Examiner*—Hung T Vy
(74) *Attorney, Agent, or Firm*—Sughrue Mion, PLLC

(57) ABSTRACT

In a process for producing a semiconductor laser element, a mask having a pair of openings is formed on a current stopping layer formed above a first cladding layer; a pair of first grooves are formed in the current stopping layer by etching using the mask; portions of the first cladding layer located at the bottoms of the pair of first grooves are etched off so as to form a pair of second grooves in the first cladding layer, and a portion of the current stopping layer left between the pair of first grooves are etched off; the pair of second grooves are filled with a material having a refractive index higher than that of the first cladding layer; and a second cladding layer is formed over the pair of second grooves and the region of the first cladding layer located between the pair of second grooves.

7 Claims, 6 Drawing Sheets

EQUIVALENT REFRACTIVE INDEX

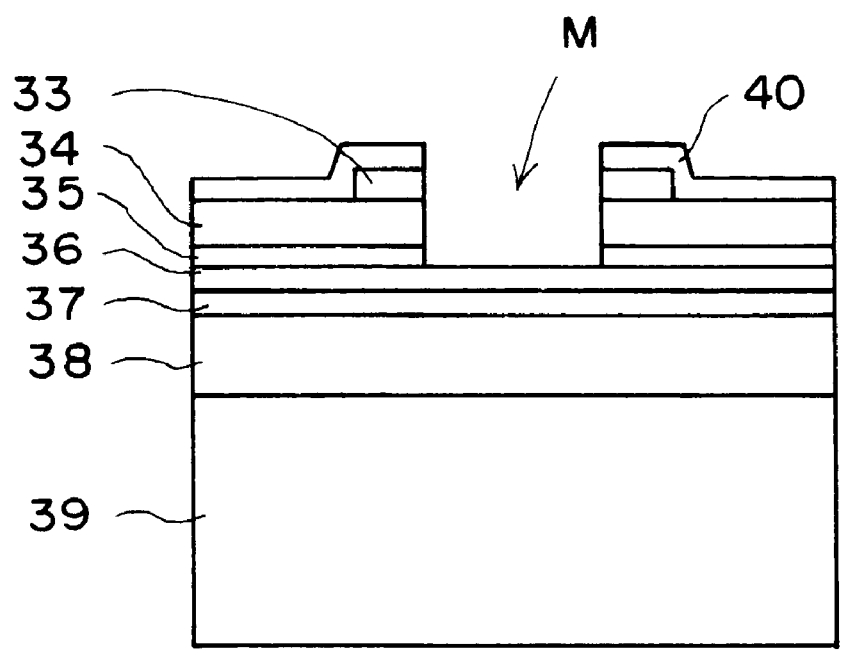

PROCESS FOR PRODUCING SEMICONDUCTOR LASER ELEMENT INCLUDING S-ARROW STRUCTURE FORMED BY ETCHING THROUGH MASK HAVING PAIR OF PARALLEL OPENINGS

BACKGROUND OF THE INVENTION

1. Field of the Invention

The present invention relates to a semiconductor laser element including an S-ARROW (Simplified Antiresonant Reflecting Optical Waveguide) structure, in which light in a fundamental transverse mode is confined within a width determined by a pair of elongated high-refractive-index layers separated from each other. The present invention also relates to a process for producing a semiconductor laser element including an S-ARROW structure.

2. Description of the Related Art

Currently, semiconductor laser elements are widely used as light sources for optical communication, optical disk devices, and the like, since laser light can be converged to a diffraction limit. However, only a portion of light emitted from each semiconductor laser element which is in phase at a light-emission end facet can be converged to a diffraction limit. The emission of light in phase at a light-emission end facet of a semiconductor laser element is called emission in a fundamental transverse mode. On the other hand, when light components having various phases coexist (i.e., light components oscillating in higher harmonic transverse modes are mixed) in light emitted from a semiconductor laser element, the light cannot be converged to a diffraction limit.

It is known that the operation in a fundamental transverse mode is more stable when an emission cross section is smaller since the mixture of higher harmonic transverse modes can be more effectively suppressed when the emission cross section is smaller. Therefore, the waveguides in the semiconductor laser elements which are required to emit light in a fundamental transverse mode are arranged to have a thickness of 1 micrometer or smaller and a width of about 2 to 4 micrometers. In particular, it is empirically known that the yield rates of the semiconductor laser elements which stably emit laser light in a fundamental transverse mode increase when the widths of the waveguides are reduced.

Nevertheless, when the emission cross section of a semiconductor laser element is reduced by reducing the width of the waveguide in the semiconductor laser element, the optical density at the light-emission end facet of the semiconductor laser element necessarily increases. The increase in the optical density causes deterioration of the constituent materials of the semiconductor laser element, and becomes a factor which decreases the lifetime of the semiconductor laser element.

In other words, the stabilization of the fundamental transverse mode (by reduction of the cross section of the waveguide) is in a trade-off relationship with the increase in the optical output since it is necessary to increase the cross section of the waveguide for increasing the optical output. Therefore, overcoming this problem is a significant challenge in the current research and development of semiconductor laser.

As an attempt to overcome the above problem, an S-ARROW structure is proposed, as disclosed by H. Yang et al. in "High-power single-mode simplified antiresonant reflecting optical waveguide (S-ARROW)," IEEE PHOTONICS TECHNOLOGY LETTERS, Vol. 10, No. 8, August 1998, pp. 1079–1081. Although this structure realizes emission in a fundamental transverse mode, the width of the emission cross section (the lateral width of the waveguide) can be increased to about 6 micrometers, which is 1.5 to 2 times greater than those in the conventional structures. Therefore, when the semiconductor laser element having an S-ARROW structure is used, it is possible to expect increase in the maximum optical output.

The reasons why the semiconductor laser elements having an S-ARROW structure can emit light in a fundamental transverse mode are explained below.

FIG. 10A shows a cross section (which is perpendicular to the laser propagation direction) of an essential portion of a semiconductor laser element having an S-ARROW structure. In the semiconductor laser element of FIG. 10A, a lower cladding layer 38 made of n-type InGaP, an SCH (separate confinement heterostructure) layer 37 being made of InGaAsP and including an InGaAs quantum-well active layer, upper cladding layers 36 and 32 made of p-type InGaP, an etching stop layer 35 made of n-type GaAs, a current stopping layer 34 made of n-type AlInP, guide portions 33 being made of n-type GaAs and having a thickness of, for example, 0.25 micrometers, and a contact layer 31 made of p-type GaAs are formed on an n-type GaAs substrate 39.

GaAs, which is used for forming the guide portions 33, has a relatively high refractive index compared with those of the constituent materials around the guide portions 33. Therefore, the equivalent refractive index in the direction parallel to the SCH layer 37 has a distribution as indicated in FIG. 10B. That is, the equivalent refractive index in the SCH layer 37 is high under the guide portions 33, and low in the other regions of the SCH layer 37.

In the above waveguide structure, the width A of each of the guide portions 33 is determined so that light in the fundamental transverse mode is confined in a region of the SCH layer 37 under the gap between the guide portions 33, and light in higher harmonic transverse modes is not confined in and leaks out from the region under the gap between the guide portions 33. In the Yang reference, the width A of each of the guide portions 33 is 0.85 micrometers, and the width B of the gap between the guide portions 33 is 6.5 micrometers.

Due to the provision of the current stopping layer 34, current which is supplied for generating laser is injected into only the region under the gap between the guide portions 33, and realizes laser gain in only the region under the gap between the guide portions 33.

Thus, only the light in the fundamental transverse mode is confined in the region under the gap between the guide portions 33, and it is possible to obtain a sufficient gain in the fundamental transverse mode. On the other hand, the light in higher harmonic transverse modes is not confined in the region under the gap between the guide portions 33. Therefore, it is impossible to obtain a substantial gain in higher harmonic transverse modes. As a result, the light in the fundamental transverse mode is dominantly emitted from the semiconductor laser element of FIG. 10A, and the semiconductor laser element of FIG. 11A can operate in a stable fundamental transverse mode even when the output power is high.

Nevertheless, when the S-ARROW structure is manufactured by the conventional technique, the yield rate is necessarily lowered for the following reasons. In order to explain the reasons, first, the conventional process for producing the semiconductor laser element including the S-ARROW structure is explained with reference to FIGS. 11 to 14.

First, as illustrated in FIG. 11, the n-type InGaP lower cladding layer 38, the SCH layer 37 being made of InGaAsP and including the InGaAs quantum-well active layer, the p-type InGaP upper cladding layer 36, the n-type GaAs etching stop layer 35, the n-type AlInP current stopping layer 34, and an n-type GaAs guide layer 33' having a thickness of 0.25 micrometers are formed in this order on the n-type GaAs substrate 39 by organometallic vapor phase epitaxy.

Next, in a first photolithography step and an etching step, the outside portions of the n-type GaAs guide layer 33' are removed so as to leave a portion of the n-type GaAs guide layer 33' including the guide portions 33 in the semiconductor laser element of FIG. 10A. Thus, a layered structure having a cross section as illustrated in FIG. 12 is obtained.

Then, in a second photolithography step, as illustrated in FIG. 13, a resist pattern 40 is formed over the layered structure of FIG. 12 except for an area corresponding to the gap (having the width B) between the guide portions 33 in the semiconductor laser element of FIG. 10A.

Thereafter, the layered structure of FIG. 13 is etched from the upper side until the p-type InGaP upper cladding layer 36 is exposed. Thus, a groove M is formed in a position corresponding to the center of the waveguide, and a layered structure having a cross section as illustrated in FIG. 14 is obtained.

Subsequently, the resist pattern 40 is removed, and then the p-type InGaP upper cladding layer 32 and the p-type GaAs contact layer 31 are formed by crystal growth. Thus, the semiconductor laser element as illustrated in FIG. 10A is obtained.

However, when the width B of the gap between the guide portions 33 is different from a predetermined width, or the gap is formed in a position different from a predetermined position, due to variations in the widths of the respective guide portions 33 or in the positions of the guide portions 33, light in modes other than the fundamental transverse mode remains in the region of the SCH layer 37 under the gap between the guide portions 33. Therefore, the semiconductor laser element emits light in the modes other than the fundamental transverse mode, or light in the fundamental transverse mode does not satisfactorily propagate in the region of the SCH layer 37 under the gap between the guide portions 33, so that the oscillation threshold current in the fundamental transverse mode rises. Specifically, even when the positions or widths of the guide portions 33 deviate by 0.1 to 0.2 micrometers from predetermined positions or widths, the characteristics of the semiconductor laser element deteriorate.

When the S-ARROW structure is formed by the conventional process explained before, it is particularly necessary to form the resist pattern 40 with a very high precision of about 0,1 micrometers in the second photolithography step so that the groove M is formed in the predetermined position as illustrated in FIG. 14. That is, if the opening of the resist pattern 40 is not precisely located at the center of the guide portions 33, the gap between the guide portions 33 is formed in a position different from the predetermined position. In addition, if the width of the opening of the resist pattern 40 does not have a predetermined width, the width B of the gap between the guide portions 33 becomes different from the predetermined width. Therefore, it is necessary to precisely control the position of the opening of the resist pattern 40, relative to the position of the aforementioned portion of the n-type GaAs guide layer 33' in the layered structure of FIG. 13. However, it is difficult to form the resist pattern 40 with high precision. Thus, according to the conventional technique, it is impossible to manufacture, at a high yield rate, the semiconductor laser element in which the gap between the guide portions 33 and the positions of the guide portions 33 are formed with high precision.

SUMMARY OF THE INVENTION

An object of the present invention is to provide a process by which a semiconductor laser element including an S-ARROW structure can be produced at a high yield rate.

Another object of the present invention is to provide a semiconductor laser element which includes an S-ARROW structure, and can be produced at a high yield rate.

(1) According to the first aspect of the present invention, there is provided a process for producing a semiconductor laser element. The process comprises the steps of: (a) forming on a substrate a plurality of layers including an active layer, a first cladding layer, and a current stopping layer in this order, where the first cladding layer has a first refractive index; (b) forming on the current stopping layer a mask having a pair of parallel openings extending in a laser propagation direction and having identical widths; (c) etching the current stopping layer by using the mask so as to form a pair of first parallel grooves extending in the laser propagation direction in the current stopping layer and a ridge between the pair of first parallel grooves; (d) etching off a pair of portions of the first cladding layer being located at the bottoms of the pair of first parallel grooves and having a predetermined depth so as to form a pair of second parallel grooves in the first cladding layer, and etching off a portion of the current stopping layer located in the ridge; (e) filling the pair of second parallel grooves with a material having a second refractive index higher than the first refractive index; and (f) forming a second cladding layer so as to cover the pair of second parallel grooves and a portion of the first cladding layer located between the pair of second parallel grooves.

Preferably, in the process according to the first aspect of the present invention, the plurality of layers may further include an etching stop layer located at the predetermined depth so that etching of the first cladding layer in step (d) stops at the etching stop layer.

The material having the second refractive index may be formed in only the pair of second parallel grooves. Alternatively, the material may be uniformly formed on the entire exposed area when the pair of second parallel grooves is filled with the material in step (e).

(2) According to the second aspect of the present invention, there is provided a semiconductor laser element comprising: a substrate; a plurality of layers being formed on the substrate and including an active layer, a first cladding layer, and a current stopping layer; and a second cladding layer. In the plurality of layers, the active layer, the first cladding layer, and the current stopping layer are formed in this order. The current stopping layer has an opening extending in a laser propagation direction and being located above a center portion of a waveguide, and a pair of parallel grooves extending in the laser propagation direction are formed at positions corresponding to side edges of the opening in the first cladding layer, and filled with a material having a refractive index higher than the refractive index of the first cladding layer. The second cladding layer is formed over the pair of parallel grooves and a portion of the first cladding layer located between the pair of parallel grooves.

Preferably, the semiconductor laser element according to the second aspect of the present invention may also have one or any possible combination of the following additional features (i) to (iii).

(i) The conductivity types of the current stopping layer and the first cladding layer may be opposite so that a current stopping structure is realized by a pn junction between the current stopping layer and the first cladding layer.

(ii) The material may be a semiconductor material.

(iii) The active layer may be made of an InGaAs material.

(3) The process according to the first aspect of the present invention and the semiconductor laser element according to the second aspect of the present invention have the following advantages.

In the process according to the first aspect of the present invention, the pair of first parallel grooves are formed in the current stopping layer by etching using the mask having the pair of parallel openings extending in the laser propagation direction and having identical widths. Then, a pair of second parallel grooves are formed in the first cladding layer by etching off the portions of the first cladding layer being located at the bottoms of the pair of first parallel grooves and having a predetermined depth, and a portion of the current stopping layer located in the ridge left between the pair of first parallel grooves is also etched off. That is, both of the pair of first parallel grooves and the pair of second parallel grooves are formed by etching.

Since the etching rate in each material is identical, the portions of the current stopping layer exposed through the pair of openings of the mask are etched at an identical etching rate, and therefore the widths and the depths of the pair of first parallel grooves formed in the current stopping layer become equal in a self-aligned manner. Similarly, the widths and the depths of the pair of second parallel grooves formed in the first cladding layer also become equal. Therefore, when the pair of openings in the mask are accurately formed on the current stopping layer, the widths and the depths of the material filling the pair of second parallel grooves become accurately identical in a self-aligned manner. Thus, it is possible to produce a semiconductor laser element having a high-precision S-ARROW structure which enables confinement of light in a fundamental transverse mode within a width determined by the pair of high-refractive-index layers (guide portions) being separated by a predetermined gap and extending in the laser propagation direction.

As explained above, by the process according to the first aspect of the present invention, it is possible to accurately form a pair of grooves having identical shapes in a self-aligned manner by etching when the pair of openings in the mask are accurately formed on the current stopping layer. Therefore, high precision position control is not required in formation of layers after the formation of the mask. Thus, it is possible to manufacture semiconductor laser elements having an S-ARROW structure at a high yield rate.

Further, when the plurality of layers further include an etching stop layer located at the predetermined depth so that etching of the first cladding layer in step (d) stops at the etching stop layer, it is possible to easily adjust the depth of the pair of parallel grooves in the first cladding layer.

The semiconductor laser element according to the second aspect of the present invention can be produced by the process according to the first aspect of the present invention. Therefore, the semiconductor laser element according to the second aspect of the present invention has an S-ARROW structure in which a pair of guide portions made of a high-refractive-index material are accurately formed. Thus, the semiconductor laser element according to the second aspect of the present invention can stably emit laser light in a fundamental transverse mode, and the oscillation threshold current in the fundamental transverse mode can be maintained in a low-current range.

DESCRIPTION OF THE DRAWINGS

FIGS. 11 to 14 are diagrammatical cross-sectional views illustrating layered structures in representative stages of the process for producing the conventional semiconductor laser element of FIG. 10A.

DESCRIPTION OF PREFERRED EMBODIMENTS

An embodiment of the present invention is explained in detail below with reference to drawings.

Construction of Embodiment

Figure 1A:
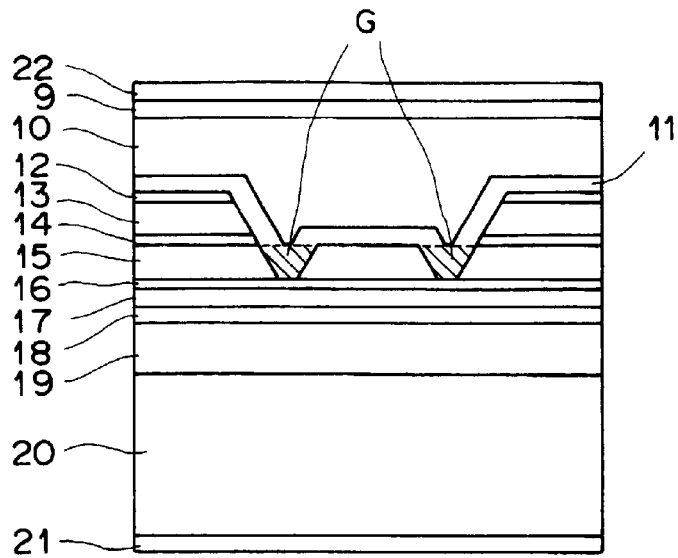
FIG. 1A is a diagrammatical cross-sectional view of a semiconductor laser element having an S-ARROW structure as an embodiment of the present invention.

FIG. 1A is a diagrammatical cross-sectional view of a semiconductor laser element having an S-ARROW structure as an embodiment of the present invention. The cross section illustrated in FIG. 1A is perpendicular to the laser propagation direction.

As illustrated in FIG. 1A, a lower cladding layer 19 made of n-type InGaP, an SCH (separate confinement heterostructure) layer 18 being made of InGaAsP and including an InGaAs quantum-well active layer, a first upper cladding layer 17 made of p-type InGaP, a first etching stop layer 16 made of p-type GaAs, a second upper cladding layer 15 made of p-type InGaP, a second etching stop layer 14 made of p-type GaAs, a current stopping layer 13 made of n-type InGaP, a protection layer 12 made of n-type GaAs, a guide layer 11 made of p-type GaAs, a third upper cladding layer 10 made of p-type InGaP, and a contact layer 9 made of p-type GaAs are formed on an n-type GaAs substrate 20. In addition, an n electrode 21 is formed on the back surface of the n-type GaAs substrate 20, and a p electrode 22 is formed on the contact layer 9. The first and second upper cladding layers in the semiconductor laser element as the embodiment of present invention correspond to the first cladding layer in the semiconductor laser element according to the second aspect of the present invention, and third upper cladding layer in the embodiment corresponds to the second cladding layer in the semiconductor laser element according to the second aspect of the present invention.

Figure 1B:
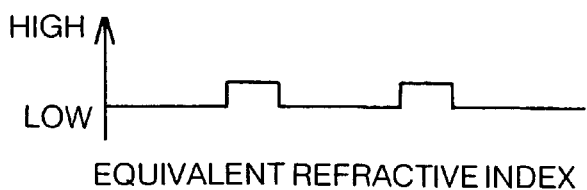
FIG. 1B is a graph indicating a distribution of the equivalent refractive index in the direction parallel to an SCH layer in the semiconductor laser element of FIG. 1A.
Figure 11:
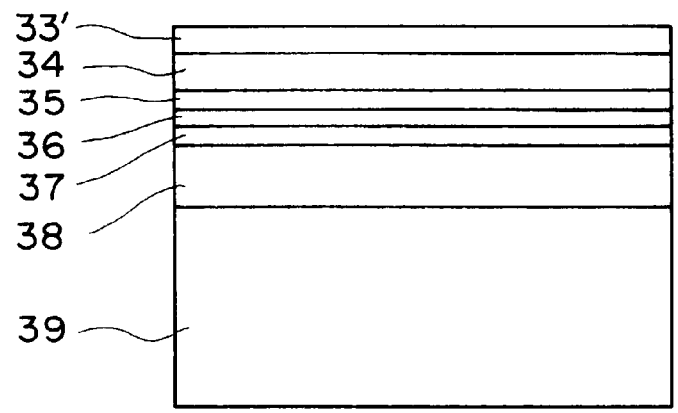
Figure 12:
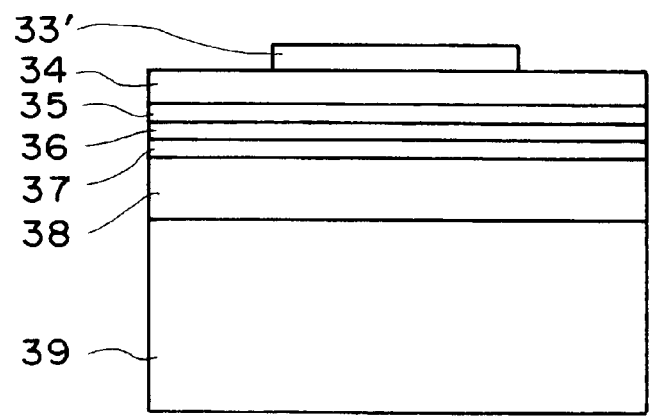
Figure 13:
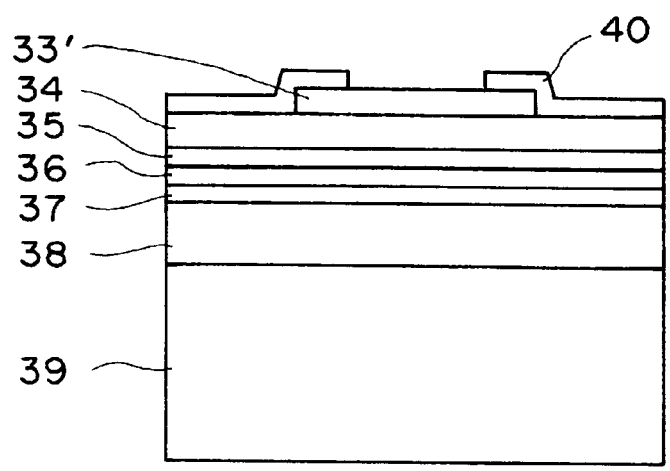

In the above construction, the semiconductor material constituting the guide layer 11 is arranged to have composition which realizes a higher refractive index than that of the semiconductor material constituting the second upper cladding layer 15. In this structure, the GaAs guide layer 11 determines the distribution of the refractive index in the direction which is perpendicular to the laser propagation direction and parallel to the substrate (i.e., parallel to the SCH layer 18). The portions G of the guide layer 11 which are located nearest to the SCH layer 18 and indicated in FIG. 1A by hatching have similar functions to the guide portions 33 in the conventional semiconductor laser element illustrated in FIG. 11A. Therefore, the equivalent refractive index in the direction parallel to the SCH layer 18 has a distribution as indicated in FIG. 1B. That is, an S-ARROW structure is realized as a waveguide structure. Alternatively, the portions of the guide layer 11 other than the above portions G may not be formed. In this case, the SCH layer 18 also has the distribution of the equivalent refractive index as indicated in FIG. 1B.

Production Process

A process for producing the semiconductor laser element of FIG. 1A is explained below with reference to FIGS. 2 to 9, which are diagrammatical cross-sectional views illustrating layered structures in representative stages of the process.

Figure 2:
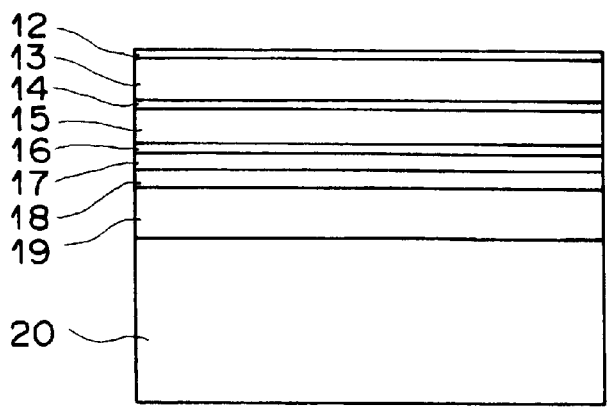
FIGS. 2 to 9 are diagrammatical cross-sectional views illustrating layered structures in representative stages of a process for producing the semiconductor laser element of FIG. 1A.

First, as illustrated in FIG. 2, the n-type InGaP lower cladding layer 19, the SCH layer 18 being made of InGaAsP and including the InGaAs quantum-well active layer, the p-type InGaP first upper cladding layer 17, the p-type GaAs first etching stop layer 16, the p-type InGaP second upper cladding layer 15, the p-type GaAs second etching stop layer 14, the n-type InGaP current stopping layer 13, and the n-type GaAs protection layer 12 are formed in this order on the n-type GaAs substrate 20 by organometallic vapor phase epitaxy.

Figure 3:
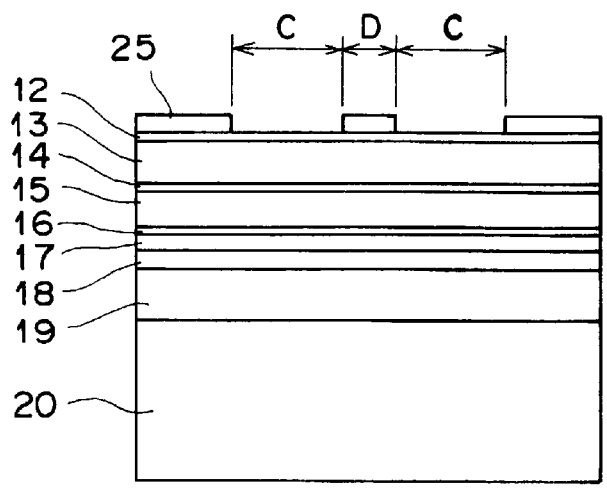

Next, as illustrated in FIG. 3, an $SiO_2$ pattern 25 which has a pair of parallel openings extending in the laser propagation direction is formed by a plasma CVD step and a first photolithography step. In this example, each of the pair of parallel openings has a width C of about 3 micrometers, and the gap D between the pair of parallel openings is about 2 micrometers.

Figure 4:
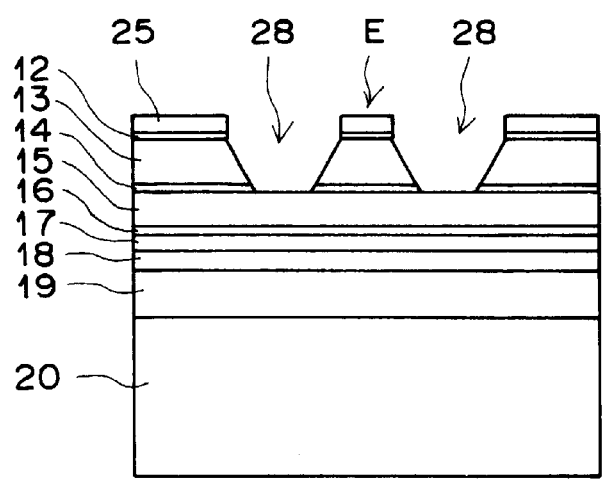

Then, as illustrated in FIG. 4, the regions of the protection layer 12, the current stopping layer 13, and the second etching stop layer 14 under the pair of parallel openings of the $SiO_2$ pattern 25 are removed by chemical etching using the $SiO_2$ pattern 25 as a mask. Thus, a pair of parallel grooves 28 extending in the laser propagation direction are formed, and a (center) ridge portion E is left between the pair of parallel grooves 28. Specifically, the above etching is performed as follows.

First, the regions of the GaAs protection layer 12 under the pair of parallel openings of the $SiO_2$ pattern 25 are etched off by using a mixture of ammonia and hydrogen peroxide, which can dissolve only GaAs. Then, the regions of the n-type InGaP current stopping layer 13 under the removed regions of the GaAs protection layer 12 are etched off by using a hydrochloric acid etchant. Since the hydrochloric acid etchant cannot dissolve GaAs, the etching with the hydrochloric acid etchant automatically stops at the upper boundary of the p-type GaAs second etching stop layer 14. Thereafter, the regions of the p-type GaAs second etching stop layer 14 under the removed regions of the n-type InGaP current stopping layer 13 are etched off by using a mixture of ammonia and hydrogen peroxide. Thus, the pair of parallel grooves 28 are formed.

Figure 5:
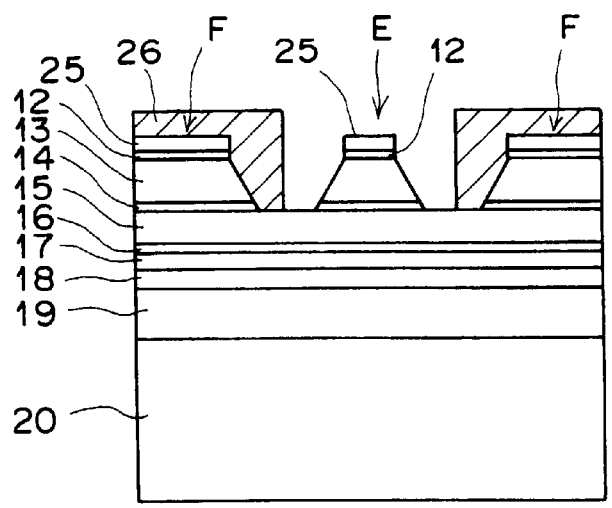
Figure 6:
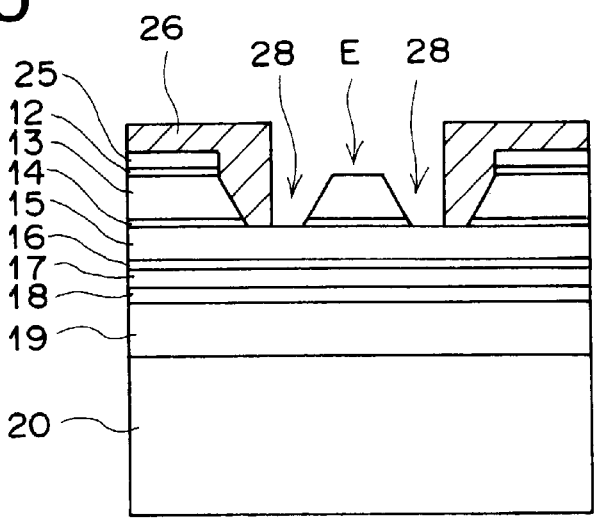

Next, in a second photolithography step, a resist pattern 26 is formed so that the ridges F on the both sides of the center ridge E are covered by the resist pattern 26, and the center ridge portion E is exposed, as illustrated in FIG. 5. In this case, high precision is not required in the formation of the resist pattern 26.

Subsequently, the portion of the $SiO_2$ pattern 25 on the top of the center ridge portion E is selectively removed by plasma etching, and then the portion of the protection layer 12 on the top of the center ridge portion E is also selectively removed with an etching solution.

Figure 7:
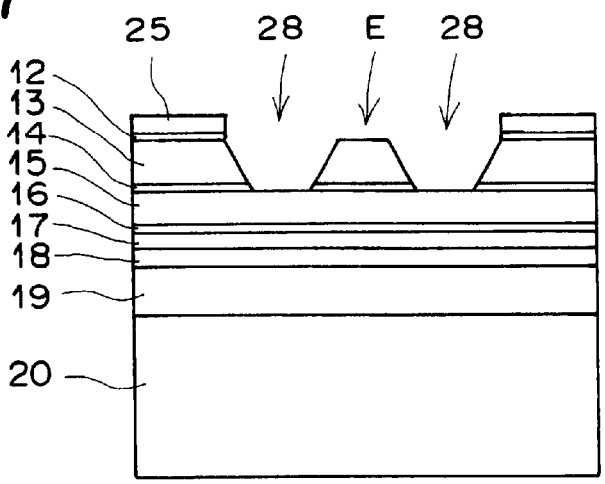
Figure 8:
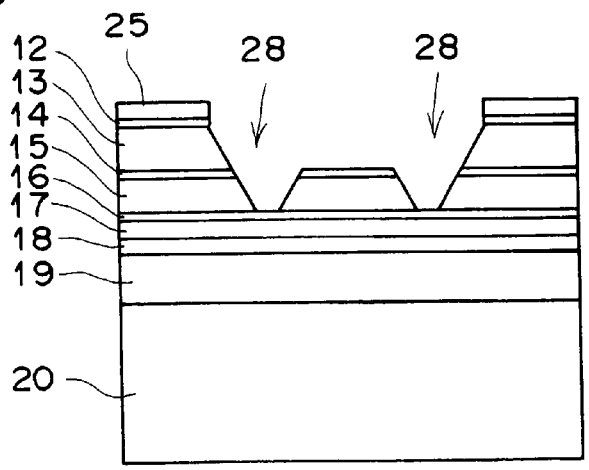

Thereafter, the resist pattern 26 is removed as illustrated in FIG. 7, and then the portion of the current stopping layer 13 on the top of the center ridge portion E and portions of the second upper cladding layer 15 at the bottom of the pair of parallel grooves 28 are removed with a hydrochloric acid etchant, as illustrated in FIG. 8, where the hydrochloric acid etchant dissolves only InGaP. Since the p-type GaAs first etching stop layer 16 is formed between the p-type InGaP first upper cladding layer 17 and the p-type InGaP second upper cladding layer 15, the etching of the p-type InGaP second upper cladding layer 15 automatically stops at the p-type GaAs first etching stop layer 16. Since the etching rate in each material is identical, the widths of the pair of parallel grooves 28 are approximately the same.

Figure 9:
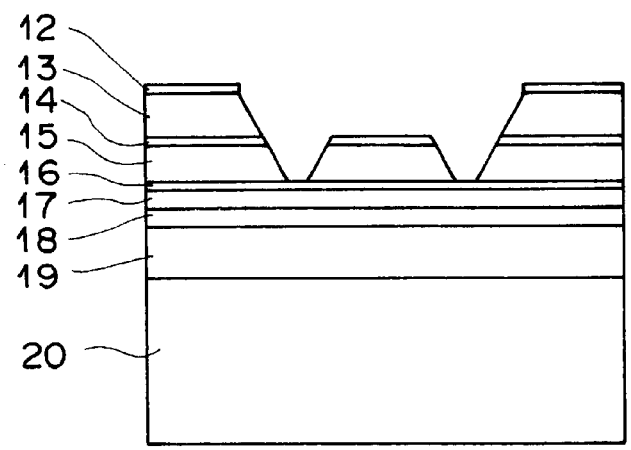
Figure 10A:
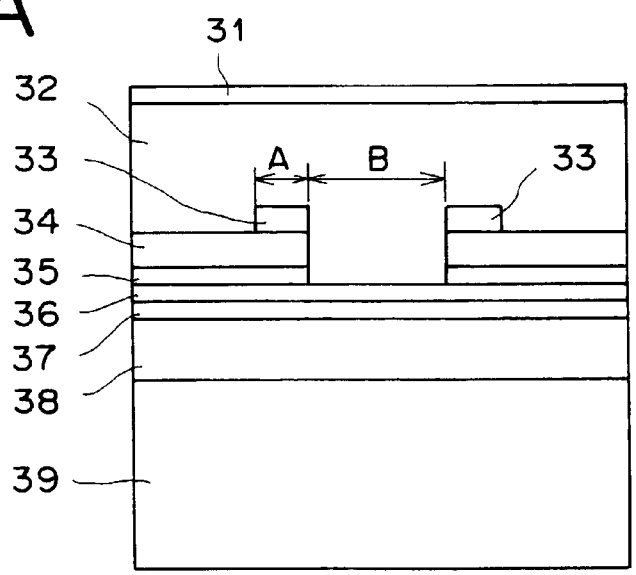
FIG. 10A is a diagrammatical cross-sectional view of a conventional semiconductor laser element having an S-ARROW structure.
Figure 10B:
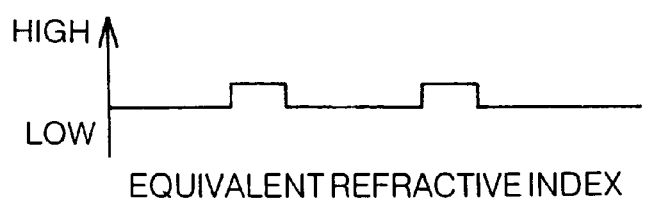
FIG. 10B is a graph indicating a distribution of the equivalent refractive index in the direction parallel to the SCH layer in the conventional semiconductor laser element of FIG. 10A.

Then, as illustrated in FIG. 9, the remaining portions of the $SiO_2$ pattern 25 on the ridges F on the both sides of the center ridge E are removed.

Next, the p-type GaAs guide layer 11, the p-type InGaP third upper cladding layer 10, and the p-type GaAs contact layer 9 are formed in this order on the layered structure of FIG. 9 by crystal growth which is realized by organometallic vapor phase epitaxy.

Subsequently, the p electrode 22 is formed on the contact layer 9. In addition, the exposed (opposite) surface of the substrate 20 is polished, and the n electrode 21 is formed on the polished surface of the substrate 20. Next, both ends of the layered construction are cleaved so as to form resonator surfaces, and a high reflectance coating and a low reflectance coating are applied to the respective resonator surfaces. Thereafter, the above construction is formed into a chip. Thus, the semiconductor laser element of FIG. 1A is obtained.

Finally, the semiconductor laser element of FIG. 1A is junction-down mounted on a heatsink by using a conductive brazing material (e.g., indium), and wires are bonded to the n electrode 21. Thus, a semiconductor laser device is completed.

Advantages and Variations

In this embodiment, the widths of the pair of grooves and the gap between the pair of grooves are determined by a resist pattern formed on the planar crystal grown surface in the first photolithography step. Therefore, high precision control is not required in the pattern formation in the second photolithography step. That is, according to the process explained above, the widths of the pair of grooves can be equally produced with high precision. Thus, the semiconductor laser element which is produced as above and includes the S-ARROW structure can stably emit laser light in a fundamental transverse mode, and the oscillation threshold current in the fundamental transverse mode is maintained in a low-current range.

Specifically, when the resonator length in the semiconductor laser element as the embodiment of the present invention is 1.2 mm, the semiconductor laser element emits laser light at the wavelength of 980 nm, and exhibits a normal optical output-current characteristic in operations with output power up to 0.5 W. In addition, the semiconductor laser element as the embodiment does not cause irregularity in the near-field image, and stable optical output can be obtained even in use in an actual system. Further, according to the process explained above, the semiconductor laser element as the embodiment can be manufactured with high reproducibility (i.e., at a high yield rate).

Although the construction of the embodiment is formed on the n-type GaAs substrate, instead, a p-type GaAs substrate may be used. When the GaAs substrate is p-type, the conductivity types of all of the other layers in the construction of the embodiment should be inverted.

Although the semiconductor laser element as the embodiment of the present invention is made of a GaAs-based material, the present invention can also be applied to semiconductor laser elements made of other types of materials such as a GaN-based or InP-based material.

The etching used in the process according to the present invention may be performed by using either liquid or gas, and any type of etching which can selectively etch InGaAsP and other crystals can be used.

What is claimed is:

1. A semiconductor laser element comprising:

a substrate;

a waveguide;

a plurality of layers being formed on said substrate and including an active layer, a first cladding layer, and a current stopping layer formed in this order, where said first cladding layer has a first refractive index, said current stopping layer has an opening extending in a laser propagation direction and being located above a center portion of the waveguide, and a pair of parallel grooves extending in said laser propagation direction are formed at positions corresponding to side edges of said opening in the first cladding layer, and filled with a material having a second refractive index higher than said first refractive index; and a second cladding layer formed over said pair of parallel grooves and a portion of said first cladding layer located between the pair of parallel grooves.

2. A semiconductor laser element according to claim 1, wherein conductivity types of said current stopping layer and said first cladding layer are opposite so that a current structure is realized by a pn junction between the current stopping layer and the first cladding layer.

3. A semiconductor laser according to claim 1, wherein said material is a semiconductor material.

4. A semiconductor laser according to claim 1, wherein said active layer is made of an InGaAs material.

5. The semiconductor laser according to claim 1, wherein the width and depth of a first of the parallel grooves are the same as the width and depth of a second of the parallel grooves.

6. The semiconductor laser according to claim 1, wherein the waveguide is formed over the plurality of layers.

7. The semiconductor laser according to claim 5, wherein the second cladding layer is formed over the pair of parallel grooves and over the waveguide.

* * * * *